(12) United States Patent
Link et al.

(10) Patent No.: US 12,712,516 B2
(45) Date of Patent: Aug. 18, 2026

(54) RECESSED FRAMES IN THICKNESS MODE PIEZOELECTRIC RESONATORS

(71) Applicant: TEXAS INSTRUMENTS INCORPORATED, Dallas, TX (US)

(72) Inventors: Steffen Paul Link, Urbana, IL (US); Ting-Ta Yen, San Jose, CA (US); Jeronimo Segovia-Fernandez, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 929 days.

(21) Appl. No.: 17/683,086

(22) Filed: Feb. 28, 2022

(65) Prior Publication Data

US 2023/0275553 A1 Aug. 31, 2023

(51) Int. Cl.

*H03H 9/17* (2006.01)
*H03H 3/04* (2006.01)
*H03H 9/02* (2006.01)

(52) U.S. Cl.

CPC .......... *H03H 9/02015* (2013.01); *H03H 3/04* (2013.01); *H03H 9/175* (2013.01); *H03H 2003/0435* (2013.01)

(58) Field of Classification Search

CPC .......................... H03H 9/02015; H03H 9/175

See application file for complete search history.

(56) References Cited

U.S. PATENT DOCUMENTS 6,087,198 A 7/2000 Panasik
6,548,942 B1 4/2003 Panasik
9,129,886 B2 9/2015 Jacobsen
9,305,971 B2 4/2016 Jacobsen
9,503,047 B2 11/2016 Jacobsen
9,524,881 B2 12/2016 Jiang
9,660,603 B2 5/2017 Jiang
9,896,330 B2 2/2018 Wachtler (Continued)

FOREIGN PATENT DOCUMENTS

CN 111817679 A * 10/2020 .............. H03H 3/02

OTHER PUBLICATIONS

Nguyen, Ngoc, et al., "A Design Approach for High-Q FBARs With a Dual-Step Frame," IEEE Transactions on Ultrasonics, Ferroelectrics, and Frequency Control, vol. 65, No. 9, Sep. 2018, 9 pages.

(Continued)

*Primary Examiner* — Bryan P Gordon
(74) *Attorney, Agent, or Firm* — Zhenhai Fu; Frank D. Cimino

(57) ABSTRACT

In some examples, an apparatus includes a first metal layer having a thickness, a piezoelectric material layer having a first side and a second side that is opposite the first side, the piezoelectric material layer first side abutting the first metal layer, the piezoelectric material layer second side having recesses, and a second metal layer abutting the piezoelectric material layer second side, the second metal layer having extensions that fill the recesses to form a metal frame that is at least partially recessed into the piezoelectric material layer. The first metal layer, the piezoelectric material layer, and the second metal layer form a resonator body. The metal frame has a shape governing a resonant mode of the resonator body.

27 Claims, 4 Drawing Sheets

(56) References Cited

U.S. PATENT DOCUMENTS 9,929,714 B2 3/2018 Jacobsen
10,009,001 B2 6/2018 Jiang
10,009,008 B2 6/2018 Jacobsen
10,135,415 B2 11/2018 Soman
10,233,074 B2 3/2019 Wachtler
10,622,966 B2 4/2020 Yen
10,686,425 B2 6/2020 Yen
10,723,616 B2 7/2020 Wachtler
10,855,251 B2 12/2020 Yen
10,861,796 B2 12/2020 Cook
11,042,026 B2 6/2021 Fedigan
2010/0187948 A1 7/2010 Sinha
2011/0249889 A1 10/2011 Kothandaraman
2016/0300693 A1 10/2016 Jiang
2017/0197414 A1* 7/2017 Naganuma ........... H10N 30/057
2018/0183406 A1 6/2018 Patil
2018/0277735 A1 9/2018 Jeong
2019/0326873 A1 10/2019 Bradley
2020/0083861 A1* 3/2020 Matsuo ................ H03H 9/0211
2020/0212880 A1* 7/2020 Segovia Fernandez ..................... C23C 14/35
2020/0212884 A1* 7/2020 Shin ......................... H03H 9/13
2020/0274514 A1 8/2020 Yen
2020/0313648 A1* 10/2020 Wang ....................... H03H 9/54
2020/0382091 A1 12/2020 Yen
2021/0083652 A1* 3/2021 Yantchev ........... H03H 9/02015
2021/0091012 A1 3/2021 Cook
2022/0093683 A1* 3/2022 Then .................... H10N 30/875
2022/0103159 A1* 3/2022 Shin ......................... H04B 1/40
2023/0115689 A1* 4/2023 Link ........................ H03H 9/17 310/367
2023/0208383 A1* 6/2023 Li ...................... H03H 9/02125 310/365

OTHER PUBLICATIONS

Office Action in corresponding U.S. Appl. No. 17/488,891 issued Nov. 17, 2025, 14 pgs.

* cited by examiner

RECESSED FRAMES IN THICKNESS MODE PIEZOELECTRIC RESONATORS

BACKGROUND

Various loss mechanisms within a piezoelectric device include both electrical and mechanical dissipation factors that may decrease performance of the piezoelectric device, increase heat generation within the piezoelectric device, or both. An input electrical impedance of a piezoelectric device is often characterized by two resonance frequencies. The first, or series resonance frequency (fs) corresponds to a frequency where the electrical impedance is at a reduced value (e.g., approximately a minimum value). The second, or parallel resonance frequency (fp) corresponds to a frequency where the electrical impedance is at approximately a maximum value. In thickness mode piezoelectric resonators, such as bulk acoustic wave (BAW) resonators, dual-Bragg acoustic resonators (DBARs), solidly mounted resonators (SMRs), and film bulk acoustic resonators (FBARs), the confinement of energy around fp is related to the quality factor (Qp) of the resonance. A factor that may lead to a decrease in Qp includes the setup and sustainment of unwanted modes in a lateral (e.g., longitudinal) direction which may leak energy out of the resonator.

SUMMARY

In some examples, an apparatus includes a first metal layer having a thickness, a piezoelectric material layer having a first side and a second side that is opposite the first side, the piezoelectric material layer first side abutting the first metal layer, the piezoelectric material layer second side having recesses, and a second metal layer abutting the piezoelectric material layer second side, the second metal layer having extensions that fill the recesses to form a metal frame that is at least partially recessed into the piezoelectric material layer. The first metal layer, the piezoelectric material layer, and the second metal layer form a resonator body. The metal frame has a shape governing a resonant mode of the resonator body.

In some examples, a system includes a first metal layer having a thickness, a piezoelectric material layer having a first side and a second side that is opposite the first side, the piezoelectric material layer first side abutting the first metal layer, the piezoelectric material layer second side having multiple recesses, a second metal layer abutting the piezoelectric material layer second side, the first metal layer, the piezoelectric material layer, and the second metal layer forming a resonator body, the second metal layer filling the multiple recesses to form a metal frame that is at least partially recessed into the piezoelectric material layer, the metal frame having a shape configured to determine a resonant mode of the resonator body, and a controller configured to apply a voltage to electrodes coupled to the first metal layer and the second metal layer to drive the piezoelectric material layer into resonance.

In some examples, a device includes a first metal layer having a first thickness and configured to be a first electrode, a second metal layer having a second thickness and configured to be a second electrode, and a piezoelectric material layer between the first metal layer and the second metal layer, the first metal layer, second metal layer, and piezoelectric material layer forming a resonator body, the piezoelectric material layer having multiple recesses and the second metal layer having multiple extensions for filling the multiple recesses, the second metal layer and extensions forming a metal frame that is at least partially recessed into the piezoelectric material layer. The metal frame has a shape governing a resonant mode of the resonator body.

DETAILED DESCRIPTION

Examples of this description provide for a piezoelectric resonator circuit useful in a piezoelectric device that includes an electrode frame that is at least partially recessed into an adjacent piezoelectric material layer. In some examples, the piezoelectric material layer includes multiple recesses and the electrode frame includes multiple extensions corresponding to (e.g., filling or partially filling) the multiple recesses. This configuration provides a structure that may shape a resonance mode of the piezoelectric device. A first width ($W_1$) is a width of the recesses and may be based on the depth of each recess. Additional duplicates of each recess/extension pair may be added along the electrode frame where each recess/extension pair is spaced apart from an adjacent recess/extension pair at a second width ($W_2$). A third width ($W_3$) defines a distance from a distal edge of a terminal recess to the distal edge of the electrode frame itself. Each of the first width, second width, and third width may be an odd multiple of an operating quarter-wavelength (e.g., $\lambda/4$) of the piezoelectric device. In at least some examples, such as for operation at approximately 2.5 GHz, the quarter-wavelength may be about 1.1 micrometer (um). In various examples, the quarter wavelength may be any specific spurious mode for which the piezoelectric device is configured to suppress. An edge of the electrode frame may be located within an active area of the piezoelectric device that includes a region surrounded by at least one reflector. In at least some examples, such a configuration of the piezoelectric resonator circuit and piezoelectric device reduces lateral modes and increases containment of energy within the piezoelectric resonator circuit.

Figures 1A, 1B:
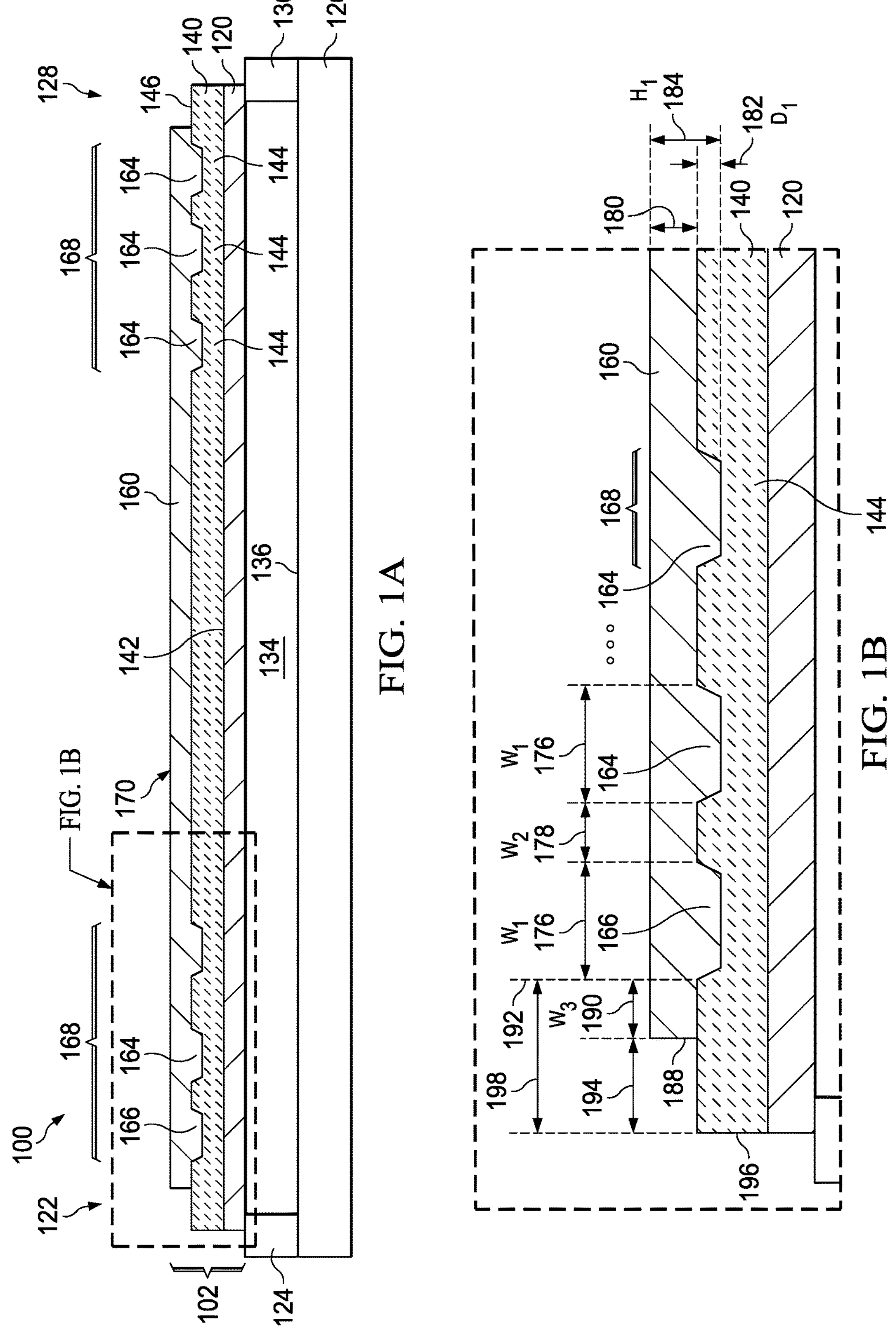
FIG. 1A is an example of a resonator system having a FBAR body, in accordance with various examples.
FIG. 1B is an enlargement of a portion of the example shown in FIG. 1A, in accordance with various examples.

FIG. 1A is an example of a resonator system 100 having an FBAR body 102 in accordance with various examples. FIG. 1B is an enlargement of a portion of FIG. 1A for clarity and ease of understanding, and both FIG. 1A and FIG. 1B may be referred to herein collectively as FIG. 1. FBAR body 102 includes a first planar metallic layer 120 having a uniform thickness (e.g., a thickness having a variance within a tolerance range) and forming a first electrode. First planar metallic layer 120 is supported on a first end 122 by a first supporting portion 124 that is a continuous extension of a substrate 126. First planar metallic layer 120 is also supported on a second end 128 by a second supporting portion 130 that is a continuous extension of substrate 126 to form a structure surrounding a released region 134. Released region 134 may allow movement of the FBAR body 102 in a vertical direction normal to a surface 136 of substrate 126. In at least some examples, the substrate 126, and therefore surface 136, may be omitted from the resonator system 100. A piezoelectric material layer 140 is coupled to an upper surface 142 of first planar metallic layer 120. A second planar metallic layer 160 is coupled to an upper surface 146 (e.g., top surface) of piezoelectric material layer 140. In this manner, piezoelectric material layer 140 is sandwiched between first planar metallic layer 120 and second planar metallic layer 160 to form FBAR body 102 over the released region 134. In some examples, first planar metallic layer 120 may have a thickness of between 0.05 to 0.5 micrometers, and may be formed of a standard metallization layer material such as molybdenum (Mo), platinum (Pt), aluminum (Al) or aluminum-copper (Al—Cu) alloy in a standard microelectromechanical system (MEMS) fabrication process. In some examples, piezoelectric material layer 140 may have a thickness of between 0.05 to a 2 micrometers. In some examples, second planar metallic layer 160 may have a thickness of between 0.05 to 0.5 micrometers, and may be formed of a standard metallization layer material such as molybdenum (Mo), platinum (Pt), Al or Al—Cu alloy in a standard MEMS fabrication process. As used herein, relative position terms such as up, down, upper, lower, above, below, right, left, top, bottom, vertical direction, lateral direction, and other similar terms denote the position of various elements relative to various other elements as shown in the accompanying drawings.

Upper surface 146 of piezoelectric material layer 140 includes multiple recesses 144 spaced at defined intervals. Similarly, second planar metallic layer 160 has multiple extensions 164, where each extension 164 fills one of the multiple recesses 144 to form multiple recessed frames 168. In this manner, multiple recessed frames 168 are at least partially recessed into the upper surface 146 of piezoelectric material layer 140. Each recess 144 has a first width 176 (shown as $W_1$), and each recess 144 is separated from a linearly adjacent recess 144 by a second width 178 (shown as $W_2$). In some examples, second planar metallic layer 160 has a thickness 180, and each recessed frame 168 has a depth 182 (shown as $D_1$) corresponding to an increased thickness 184 (shown as Hi) of second planar metallic layer 160 at the recessed frames 168 in comparison to the thickness 180 of second planar metallic layer 160 away from the multiple recessed frames 168. In this manner, multiple recessed frames 168 may be added to form adjacent multiple recesses 144, each of which are separated from each other by the second width 178. Responsive to a voltage being applied across first planar metallic layer 120 and second planar metallic layer 160, piezoelectric material layer 140 may begin to generate various acoustic waves at resonant frequencies corresponding to the dimensions of the FBAR body 102. The multiple extensions 164 of second planar metallic layer 160 are engaged with multiple recesses 144 in a manner that attenuates propagation of spurious energy of the acoustic waves within piezoelectric material layer 140 in a lateral (e.g., lengthwise) direction. In this manner, lateral acoustic energy leakage is reduced based on the multiple extensions 164 and the multiple recesses 144, improving a resonator quality factor (Qp) at a parallel resonance frequency (fp). The first width 176 for each recess 144 may be determined based on the depth 182 of each recess 144. In some examples, a ratio of first width 176 to second width 178 is within a range of 3:1.

In some implementations, an edge 188 of second planar metallic layer 160 is located an edge width 190 distance ($W_3$) from a distal edge 192 of a terminal recess 144 of second planar metallic layer 160. Edge 188 is located a distance 194 from an edge 196 of piezoelectric material layer 140 and first planar metallic layer 120. In this manner, distal recess 166 (e.g., the terminal recess 144) is located at an end portion of piezoelectric material layer 140 at a distance 198 from edge 196 and edge of first planar metallic layer 120. In at least some examples, distance 198 may have any suitable value. Distal recess 166 may be otherwise identical to each of the multiple recesses 144 except that distal recess 166 is located at an end of piezoelectric material layer 140. In some examples, an operating wavelength of the FBAR body 102 is λ, and edge width distance 190 is an odd multiple of λ/4. Second planar metallic layer 160 and edge 188 are located within an active region of FBAR body 102. In the example of FIG. 1, the active region of FBAR body 102 includes the portion of FBAR body 102 where vibrations are formed, such as the second planar metallic layer 160, including the multiple extensions 164, a portion of the piezoelectric material layer 140 beneath the second planar metallic layer 160, and a portion of the first planar metallic layer 120 beneath the second planar metallic layer 160.

Figure 2:
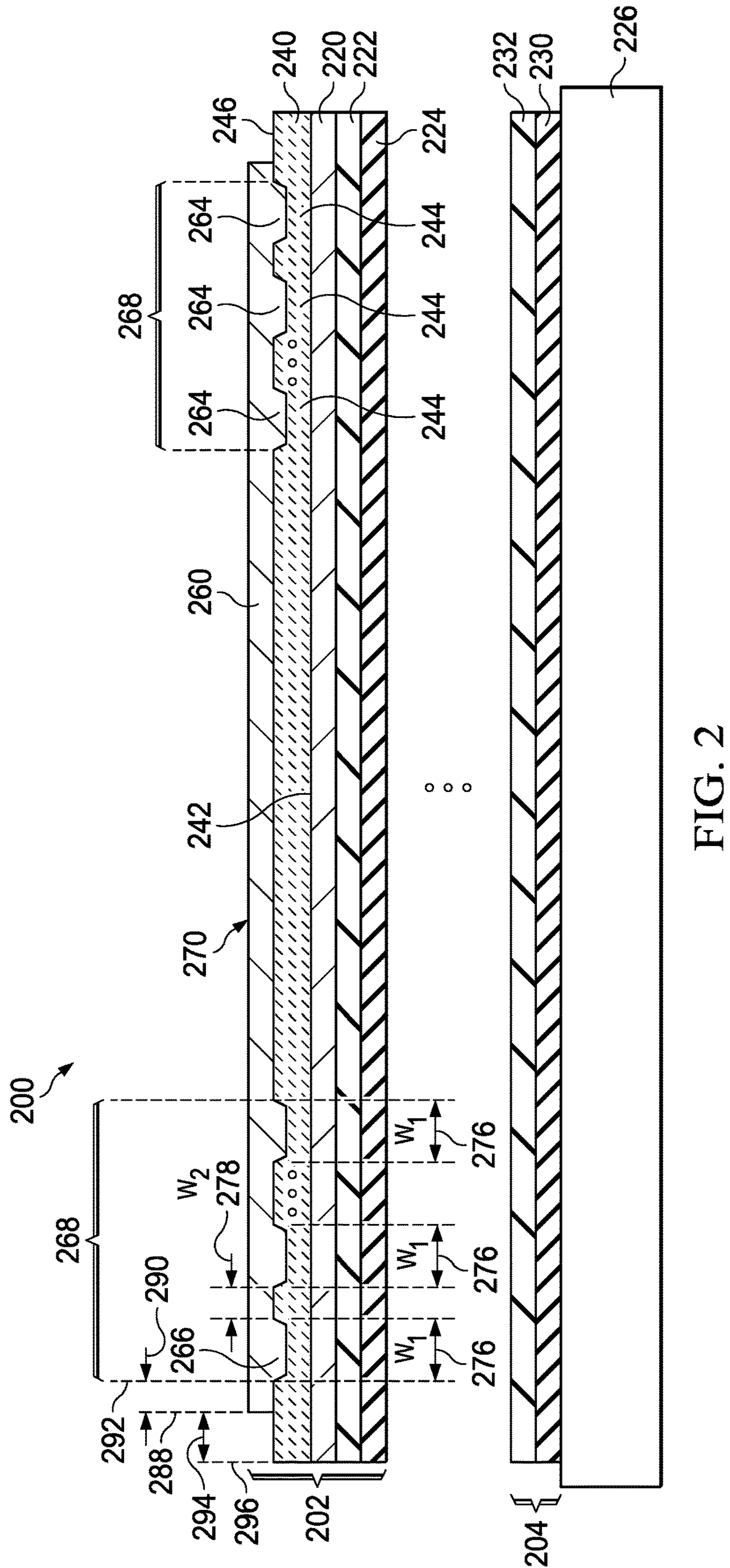
FIG. 2 is an example of a resonator system having a SMR body and acoustic reflectors between the SMR body and its substrate, in accordance with various examples.

FIG. 2 is an example of a resonator system 200 having an SMR body 202 and acoustic reflectors 204 in accordance with various examples. In various examples, the resonator system 200 includes any number of acoustic reflectors 204, such as based on a strength of the spurious modes that may be present in the resonator system 200. SMR body 202 includes a first planar metallic layer 220 having a uniform thickness and forming a first electrode. A piezoelectric material layer 240 is coupled to an upper surface 242 of first planar metallic layer 220. A second planar metallic layer 260 is coupled to an upper surface 246 (e.g., top surface) of piezoelectric material layer 240. In this manner, piezoelectric material layer 240 is sandwiched between first planar metallic layer 220 and second planar metallic layer 260. A low impedance layer 222 is coupled to a lower surface of first planar metallic layer 220, and a high impedance layer 224 is coupled to a lower surface of low impedance layer 222. In this manner, high impedance layer 224, low impedance layer 222, first planar metallic layer 220, piezoelectric material layer 240, and extended frame 270 form SMR body 202.

Upper surface 246 of piezoelectric material layer 240 includes multiple recesses 244 spaced at defined intervals. Similarly, second planar metallic layer 260 has multiple extensions 264, where each extension 264 fills one of the multiple recesses 244 to form multiple recessed frames 268. In this manner, second planar metallic layer 260 forms an extended frame 270 with multiple recessed frames 268 that are at least partially recessed into the upper surface 246 of piezoelectric material layer 240. Each recess 244 has a first width 276 (shown as $W_1$), and each recess 244 is separated from a linearly adjacent recess 244 by a second width 278 (shown as $W_2$). In some examples, second planar metallic layer 260 has a thickness corresponding to an increased thickness of second planar metallic layer 260 at the recessed frames 268 compared with the thickness of second planar metallic layer 260 away from the multiple recessed frames 268. In this manner, multiple recessed frames 268 may be added to extended frame 270 where adjacent multiple recesses 244 are separated from each other by second width

278. A specific first width 276 for each recess 244 may be determined based on the depth (shown as $D_1$) of each recess 244.

Similar to FBAR body 102, as described in reference to FIG. 1, an edge 288 of second planar metallic layer 260 is located an edge width distance 290 from a distal edge 292 of a terminal recess 244 of second planar metallic layer 260. Edge 288 is located a distance 294 from an edge 296 of piezoelectric material layer 240 and first planar metallic layer 220. In this manner, distal recess 266 (e.g., the terminal recess 244) is located at an end portion of piezoelectric material layer 240 at a distance 298 from edge 296 of piezoelectric material layer 240 and first planar metallic layer 220. Distal recess 266 may be otherwise identical to each of the multiple recesses 244 except that distal recess 266 is located at an end of piezoelectric material layer 240. In some examples, an operating wavelength of SMR body 202 is k, and edge width distance 290 is an odd multiple of λ/4. Second planar metallic layer 260 and edge 288 are located within an active region of SMR body 202.

While a single acoustic reflector 204 is shown in FIG. 2, the resonator system 200 may include any number of acoustic reflectors stacked between the substrate 226 and the SMR body 202. Acoustic reflector 204 is configured to reflect energy toward an active region of SMR body 202. For example, acoustic reflector 204 may be configured to confine energy around a parallel resonance frequency (fp) of SMR body 202. Acoustic reflector 204 is disposed on a substrate 226 on which is formed a stack of layers including a high impedance layer 230, and a low impedance layer 232. In this manner, the impedance contrasts (e.g., low:high) between adjacent layers may reflect acoustic energy from SMR body 202 back toward SMR body 202 rather than conduct the acoustic energy away from SMR body 202. Acoustic reflector 204 may be solidly mounted on substrate 226. The acoustic reflector 204 of FIG. 2 may be formed according to any number and/or type(s) of steps, processes, methods, etc. In at least some examples, the acoustic reflector 204 confines thickness direction shear and longitudinal acoustic waves to the SMR body 202. The acoustic reflector 204 may confine the acoustic waves based on deposition of multiple layers of low and high impedance layers in alternating patterns, as opposed to backside etching or other release methods to remove substrate, as in the FBAR body 102 of FIG. 1.

Figure 3:
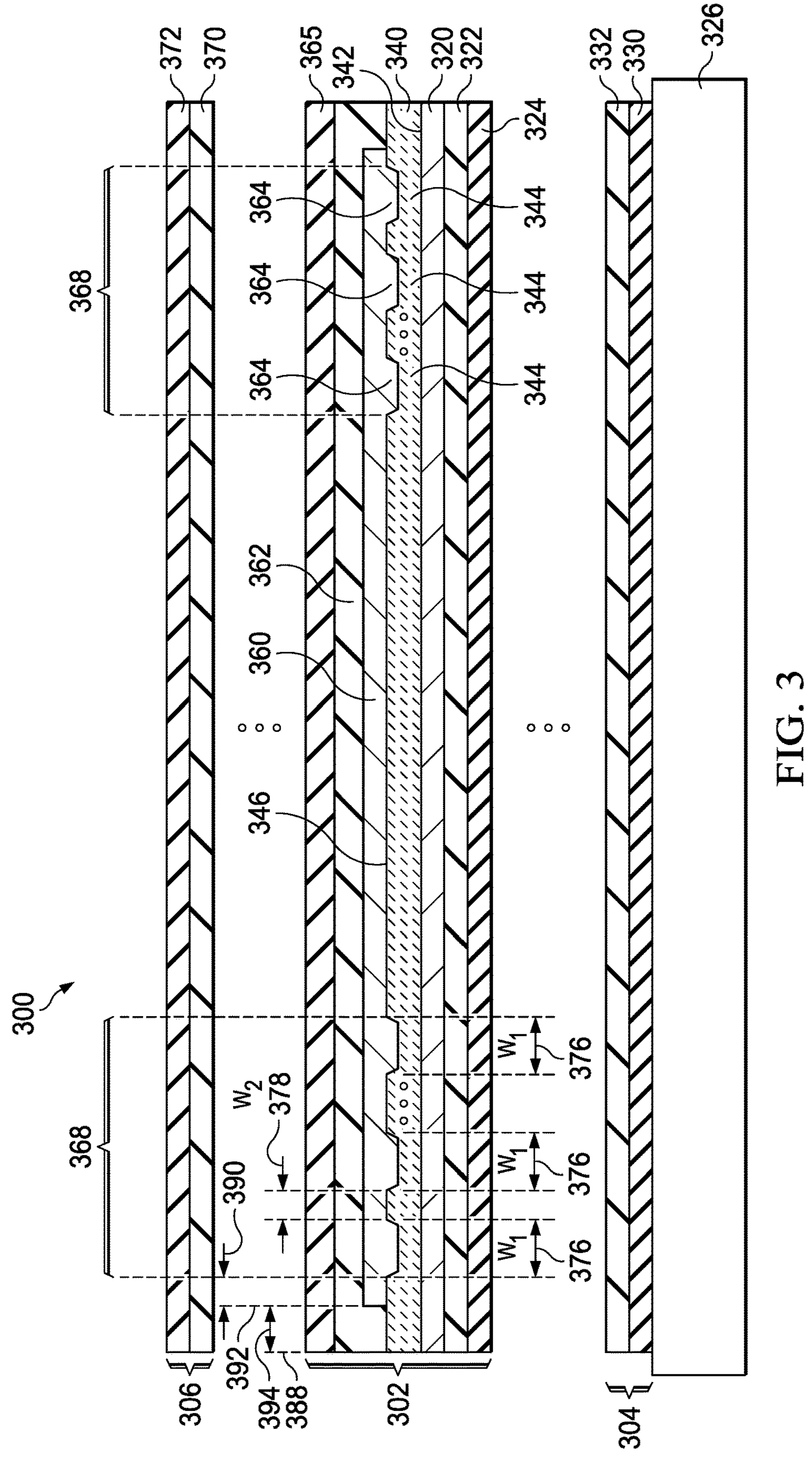
FIG. 3 is an example of a resonator system having a DBAR body and acoustic reflectors on top and beneath the DBAR body, in accordance with various examples.

FIG. 3 is an example of a resonator system 300 having a DBAR body 302, a first acoustic reflector 304, and a second acoustic reflector 306, in accordance with various examples. DBAR body 302 includes a first planar metallic layer 320 having a uniform thickness and forming a first electrode. A piezoelectric material layer 340 is coupled to an upper surface 342 of first planar metallic layer 320. A second planar metallic layer 360 is coupled to an upper surface 346 (e.g., top surface) of piezoelectric material layer 340. In this manner, piezoelectric material layer 340 is sandwiched between first planar metallic layer 320 and second planar metallic layer 360. A low impedance layer 322 is coupled to a lower surface of first planar metallic layer 320, and a high impedance layer 324 is coupled to a lower surface of low impedance layer 322. A low impedance layer 362 is coupled to a top surface of second planar metallic layer 340, and a high impedance layer 365 is coupled to a top surface of low impedance layer 362. In this manner, high impedance layer 324, low impedance layer 322, first planar metallic layer 320, piezoelectric material layer 340, second planar metallic layer 360, low impedance layer 362, and high impedance layer 365 form DBAR body 302.

Upper surface 346 of piezoelectric material layer 340 includes multiple recesses 344 spaced at defined intervals. Similarly, second planar metallic layer 360 has multiple extensions 364 where each extension 364 fills one of the multiple recesses 344 to form multiple recessed frames 368. In this manner, second planar metallic layer 360 forms an extended frame with multiple recessed frames 368 that are at least partially recessed into the upper surface 346 of piezoelectric material layer 340. Each recess 344 has a first width 376 (shown as $W_1$), and each recess 344 is separated from a linearly adjacent recess 344 by a second width 378 (shown as $W_2$). In some examples, second planar metallic layer 360 has a thickness corresponding to an increased thickness of second planar metallic layer 360 at the recessed frame 368 compared with the thickness of second planar metallic layer 360 away from the multiple recessed frames 368. In this manner, multiple recessed frames 368 may be added to the extended frame formed by the second planar metallic layer 360, where adjacent multiple recesses 344 are separated from each other by second width 378. A specific first width 376 for each recess 344 may be determined based on the depth (shown as $D_1$) of each recess 344.

Similar to FBAR body 102, as described in reference to FIG. 1, an edge 388 of second planar metallic layer 360 is located an edge width distance 390 from a distal edge of a terminal recess 344 of second planar metallic layer 360. Edge 388 is located a distance 394 from an edge 392 of piezoelectric material layer 340 and first planar metallic layer 320. In this manner, distal recess 366 (e.g., the terminal recess 344) is located at an end portion of piezoelectric material layer 340 at a distance 398 from edge 388 of piezoelectric material layer 340 and first planar metallic layer 320. Distal recess 366 may be otherwise identical to each of the multiple recesses 344 except that distal recess 366 is located at an end of piezoelectric material layer 340. In some examples, an operating wavelength of DBAR body 302 is λ, and edge width distance 390 is an odd multiple of λ/4. Second planar metallic layer 360 and edge 392 are located within an active region of DBAR body 302.

While a single first acoustic reflector 304 is shown in FIG. 3, the resonator system 300 may include any number of first acoustic reflectors 304 stacked between the substrate 326 and the DBAR body 302. First acoustic reflector 304 is configured to reflect energy toward an active region of DBAR body 302. For example, first acoustic reflector 304 may be configured to confine energy around a parallel resonance frequency (fp) of DBAR body 302. First acoustic reflector 304 is disposed on a substrate 326 on which is formed a stack of layers including a high impedance layer 330, and a low impedance layer 332. In this manner, the impedance contrast (e.g., low:high) between adjacent layers may reflect acoustic energy from DBAR body 302 back toward DBAR body 302 rather than conduct the acoustic energy away from DBAR body 302. First acoustic reflector 304 may be solidly mounted on substrate 326. The first acoustic reflector 304 of FIG. 3 may be formed according to any number and/or type(s) of steps, processes, methods, etc.

While a single second acoustic reflector 306 is shown in FIG. 3, the resonator system 300 may include any number of second acoustic reflectors 306 stacked on the DBAR body 302. Second acoustic reflector 306 is configured to reflect energy toward an active region of DBAR body 302. In particular, second acoustic reflector 306 may be configured to confine energy around a parallel resonance frequency (fp) of DBAR body 302. Second acoustic reflector 306 is formed in a stack of layers including a low impedance layer 370 and a high impedance layer 372. In this manner, the impedance contrast (e.g., low:high) between adjacent layers may reflect acoustic energy from DBAR body 302 back toward DBAR body 302 rather than conduct the acoustic energy away from DBAR body 302. The second acoustic reflector 306 of FIG. 3 may be formed according to any number and/or type(s) of steps, processes, methods, etc.

Figure 4:
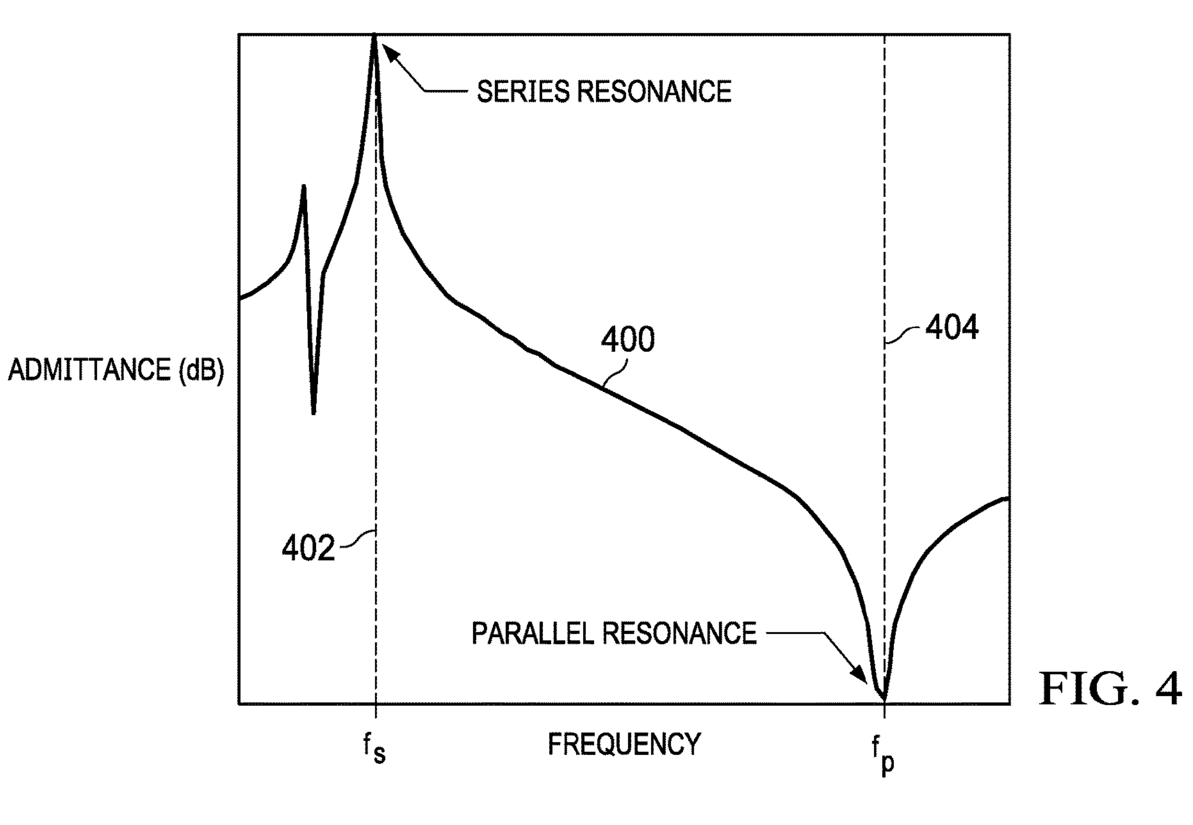
FIG. 4 is an example of an admittance response of a thickness mode piezoelectric resonator with a highlighted series resonance frequency, a parallel resonance frequency, and a spurious mode, in accordance with various examples.

FIG. 4 is a graph of an admittance response of a thickness mode piezoelectric resonator with a highlighted fs 402 and an fp 404, in accordance with various examples. The graph of FIG. 4 represents the admittance response, in units of decibels, on a vertical axis of the graph and frequency, in units of hertz (Hz), on the horizontal axis. An input electrical impedance of a piezoelectric device can be characterized by two resonance frequencies. The first, fs, corresponds to a series mechanical resonance of the piezoelectric device. The second, fp, corresponds to a parallel mechanical resistance of the piezoelectric device. Electrical admittance is the reciprocal (e.g., inverse) of electrical impedance. Therefore, fs 402 corresponds to a frequency at which the electrical admittance is at a maximum and fp 404 corresponds to a frequency at which the electrical admittance is reduced (such as at a minimum, in some examples).

Figure 5:
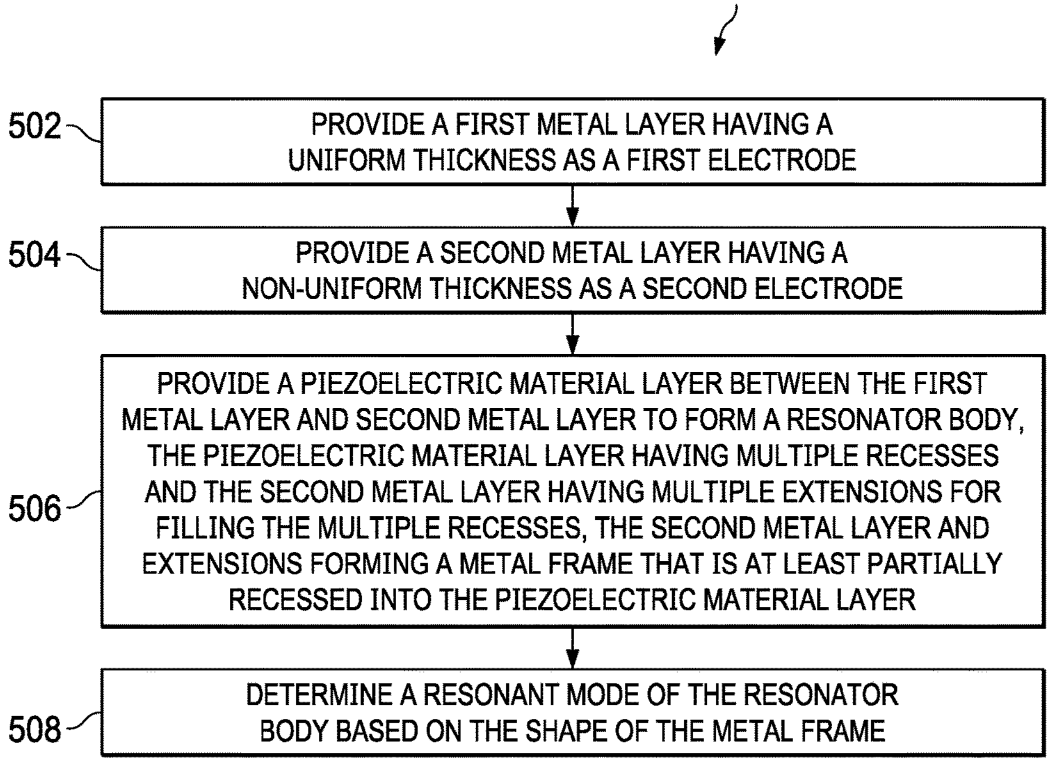
FIG. 5 is an example flow diagram of a control scheme for a piezoelectric resonator, in accordance with various examples.

FIG. 5 is a flow diagram of a method 500 for a piezoelectric resonator, in accordance with various examples. In an example, method 500 begins at operation 502 with providing a first metal layer having a uniform thickness and configured to be a first electrode at 502. Method 500 continues at operation 504 with providing a second metal layer having a non-uniform thickness (e.g., a thickness having a variance outside of a tolerance range), the second metal layer configured to be a second electrode at 504. Method 500 continues at operation 506 with providing a piezoelectric material layer between the first metal layer and the second metal layer. In this manner, the first metal layer, the second metal layer, and the piezoelectric material layer are configured to form a resonator body, such as described above with respect to FBAR body 102, SMR body 202, and DBAR body 302. In some examples, the piezoelectric material layer has multiple recesses and the second metal layer has multiple extensions for filling the multiple recesses. The second metal layer and extensions may be configured to form a metal frame that is at least partially recessed into the piezoelectric material layer. Method 500 concludes at operation 508 with determining a resonant mode of the resonator body based on the shape of the metal frame.

Various applications of the disclosed examples may be implemented in an ultrasonic diagnostic instrument that includes one or more piezoelectric resonators, as described above in reference to FIGS. 1-3. Other applications are possible. For example, the disclosed examples may be implemented as oscillators, such as frequency reference oscillators for voltage-controlled oscillators in communications devices, embedded processors, such as implemented in communication devices (e.g., cell phones, wireless routers, Internet of Things devices, etc.)

As used herein, a circuit may refer to a complete circuit or a portion thereof including coupled electrical elements. For example, a circuit may include a piezoelectric resonator body configured to form part of a larger circuit including a controller that is configured to apply an electrical signal across a portion of the piezoelectric resonator body.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device either at a time of manufacture or after a time of manufacture, such as by an end-user and/or a third-party.

Unless otherwise stated, "about," "approximately," or "substantially" preceding a value means +/−10 percent of the stated value. Modifications are possible in the described examples, and other examples are possible within the scope of the claims.

What is claimed is:

1. An apparatus, comprising:

a first metal layer;

a second metal layer; and a piezoelectric material layer between the first and second metal layer along an axis, the piezoelectric material layer including first portions and second portions, each of the second portions having a smaller thickness than the first portions and overlapping both the first and second metal layers.

2. The apparatus of claim 1, wherein the axis is a first axis, parts of the first or second metal layers abutting the first and second portions are part of a metal frame, and the metal frame is configurable to set a resonance quality factor and set spurious resonant modes along a second axis angled from the first axis.

3. The apparatus of claim 1, wherein the axis is a first axis, the first and second portions are part of recesses each having a first width along a second axis angled from the first axis, adjacent recesses are separated by a second width.

4. The apparatus of claim 3, wherein a ratio of the first width to the second width is within a range of 3:1.

5. The apparatus of claim 3, wherein the first and second metal layers and the piezoelectric material layer form a resonator having an operating wavelength, and an edge of one of the first or second metal layers is separated from one of the second portions by a distance that is an odd multiple of a quarter of the operating wavelength.

6. The apparatus of claim 1, further comprising an acoustic reflector opposing the first metal layer.

7. The apparatus of claim 6, wherein the acoustic reflector is configurable to confine energy around a parallel resonance frequency of a resonator comprising the first and second metal layers and the piezoelectric material layer.

8. The apparatus of claim 6, wherein the acoustic reflector is a first acoustic reflector, further comprising a second acoustic reflector opposing the second metal layer.

9. The apparatus of claim 8, wherein the first acoustic reflector and the second acoustic reflector are configured to confine energy around a parallel resonance frequency of a resonator comprising the first and second metal layers and the piezoelectric material layer.

10. A system, comprising:

a piezoelectric resonator including:

a first metal layer;

a second metal layer; and a piezoelectric material layer between the first and second metal layer along an axis, the piezoelectric material layer including first portions and second portions, each of the second portions having a smaller thickness than the first portions and overlapping both the first and second metal layers; and a controller coupled to the first metal layer and the second metal layer, the controller configurable to drive the piezoelectric material layer into resonance.

11. The system of claim 10, wherein the axis is a first axis, the first and second portions are part of recesses each having a first width along a second axis angled from the first axis, adjacent recesses are separated by a second width.

12. The system of claim 11, wherein a ratio of the first width to the second width is within a range of 3:1.

13. The system of claim 11, wherein the first and second metal layers and the piezoelectric material layer are part of a resonator having an operating wavelength, and an edge of one of the first or second metal layers is separated from one of the second portions by a distance that is an odd multiple of a quarter of the operating wavelength.

14. The system of claim 11, further comprising an acoustic reflector opposing the first metal layer.

15. The system of claim 14, wherein the acoustic reflector is configurable to confine energy around a parallel resonance frequency of a resonator comprising the first and second metal layers and the piezoelectric material layer.

16. A device, comprising:

a first metal layer;

a second metal layer; and a piezoelectric material layer between the first metal layer and the second metal layer, the piezoelectric material layer having recesses that overlap with the first and second metal layer.

17. The device of claim 16, wherein the piezoelectric material layer is between the first and second metal layers along a first axis, parts of the first or second metal layers abutting the recesses are part of a metal frame, and the metal frame is configurable to set a resonance quality factor and set spurious resonant modes along a second axis angled from the first axis.

18. The device of claim 16, further comprising a controller coupled to the first and second metal layers and configurable to drive the piezoelectric material layer into resonance.

19. The device of claim 16, wherein each of the recesses has a first width, the recesses being separated from each other by at least a second width.

20. The device of claim 19, wherein a ratio of the first width to the second width is within a range of 3:1.

21. The apparatus of claim 1, further comprising:

a substrate; and support portions on the substrate, wherein the second metal layer is coupled to the support portions.

22. The apparatus of claim 1, further comprising a substrate having a surface, wherein the second metal layer is over and conformal to the surface of the substrate.

23. The apparatus of claim 1, wherein the first and second metal layers and the piezoelectric material layer is part of an oscillator circuit having an output, and the apparatus further comprises a system coupled to the oscillator circuit.

24. The apparatus of claim 1, wherein the first and second metal layers and the piezoelectric material layer is part of an acoustic sensing circuit.

25. The apparatus of claim 1, further comprising an oscillator including the first metal layer, the second metal layer, and the piezoelectric material layer.

26. The apparatus of claim 25, wherein the oscillator is a frequency reference oscillator, and the apparatus further comprises a device coupled to the frequency reference oscillator.

27. The apparatus of claim 1, further comprising an ultrasonic diagnostic device including the first metal layer, the second metal layer, and the piezoelectric material layer.

* * * * *